(12) United States Patent
Noda et al.

(10) Patent No.: US 7,120,344 B2
(45) Date of Patent: *Oct. 10, 2006

(54) TWO-DIMENSIONAL PHOTONIC CRYSTAL CAVITY AND CHANNEL ADD/DROP FILTER

(75) Inventors: Susumu Noda, Uji (JP); Takashi Asano, Kyoto (JP); Yoshihiro Akahane, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/708,124

(22) Filed: Feb. 9, 2004

(65) Prior Publication Data

US 2004/0165850 A1    Aug. 26, 2004

(30) Foreign Application Priority Data

Feb. 10, 2003    (JP)    ............... 2003-032473

(51) Int. Cl.
*G02B 6/10*    (2006.01)
(52) U.S. Cl. ............... 385/129; 385/130; 385/131; 385/132
(58) Field of Classification Search ......... 385/129–132
See application file for complete search history.

(56) References Cited

U.S. PATENT DOCUMENTS

| | | |
|---|---|---|
| 2002/0009277 A1 | 1/2002 | Noda et al. |
| 2002/0191905 A1 | 12/2002 | Prather et al. |

FOREIGN PATENT DOCUMENTS

| | | |
|---|---|---|
| JP | 2001-272555 A | 10/2001 |
| JP | 2003-279764 A | 10/2003 |
| WO | PCT/JP03/03762 | 10/2003 |

OTHER PUBLICATIONS

Akahane, Yoshihiro, et al., "Design of a channel drop filter by using a donor-type cavity with high-qality factor in a two-dimensional photonic crystal slab," Mar. 3, 2003, Applied Physics Letters, vol. 82, No. 9, pp. 1341-1343.*
Srinivasan, Kartik and Painter, Oskar, "Momentum space design of high-Q photonic crystal optical cavities," Jul. 29, 2002, Optics Express, vol. 10, No. 15, pp. 670-684.*
A. Chutinan and S. Noda, "Waveguides and waveguide bends in two-dimensional photonic crystal slabs," Physical Review B, vol. 62, No. 7, 2000, pp. 4488-4492.
Y. Akahane, et al., "Design of channel drop filter by using a donor-type cavity with high-quality factor in a two-dimensional photonic crystal slab," Applied Physics Letters, vol. 82, No. 9, pp. 1341-1343.

(Continued)

*Primary Examiner*—Brian Healy
*Assistant Examiner*—Jerry Martin Blevins
(74) *Attorney, Agent, or Firm*—James W. Judge

(57) ABSTRACT

The Q factor and electric field pattern (radiation pattern) for a cavity made from a donor-type point defect 4 as is illustrated in FIG. 1 were simulated by the FDTD method. The simulation parameters were configured by selecting silicon for the slab 1; and setting approximately 1.55 μm, which is generally used in optical communications, for the wavelength λ; 0.42 μm for the lattice constant a; 0.6a for the slab 1 thickness; and 0.29a for the predetermined sectional radius of the through-holes 2.

11 Claims, 8 Drawing Sheets

Displacement = (*l*, *m*, *n*)

OTHER PUBLICATIONS

Y. Akahane, et al., "Investigation of high-Q channel drop filters using donor-type defects in two-dimensional photonic crystal slabs," Applied Physics Letters, vol. 83, No. 8, pp. 1512-1514.

Y. Akahane, et al., "High-Q photonic nanocavity in a two-dimensional photonic crystal," Nature, vol. 425, Oct. 2003, pp. 944-947.

H. Benisty, et al., "Optical and Confinement Properties of Two-dimensional Photonic Crystals," Journal of Lightwave Technology, vol. 17, No. 11, Nov. 1999, pp. 2063-2077.

Joon Huh, et al., "Nondegenerate monopole mode of single defect two-dimensional triangular photonic band-gap cavity," Journal Of Applied Physics, American Institute of Physics, vol. 92, No. 2, Jul. 15, 2002, pp. 654-659.

F. Gadot, et al., "Experimental study and modelling of high-transmission defect modes in photonic crystals with graphite structure," Photonic Crystals and Microstructures, IEE Proc.-Optoelectron, vol. 145, No. 6, Dec. 1998, pp. 415-419.

S. Noda, et al., "Trapping and emission of photons by a single defect in a photonic bandgap structure," Nature, vol. 407, Oct. 5, 2000, pp. 608-810.

O. Painter, et al., "Two-Dimensional Photonic Band-Gap Defect Mode Laser," SCIENCE, vol. 284, Jun. 11, 1999, pp. 1819-1821.

J. Vuckovic, et al., "Design of phtonic crystal microcavities for cavity QED," Physical Review E, vol. 65, pp. 016608-1 to 016608-11.

O. Painter, et al., "Defect modes of a two-dimensional photonic crystal in an optically thin dielectric slab," J. Opt. Soc. Am. B, vol. 16, No. 2, Feb. 1999, pp. 275-285.

* cited by examiner

Displacement = (*l*, *m*, *n*)

Γ–J Displacement

FIG. 13A
FIG. 13B
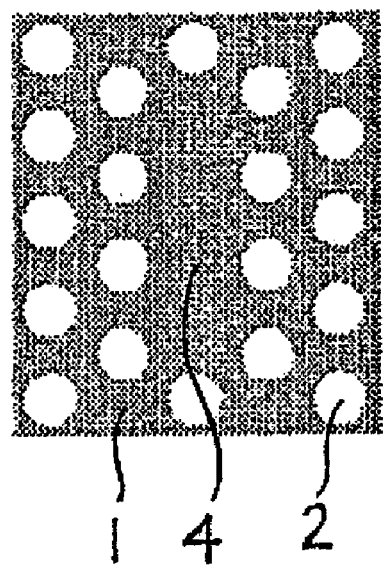
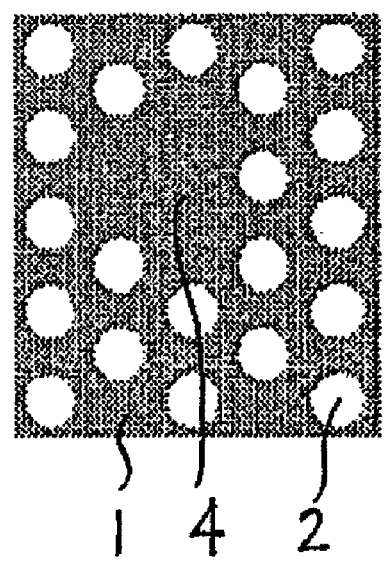

TWO-DIMENSIONAL PHOTONIC CRYSTAL CAVITY AND CHANNEL ADD/DROP FILTER

BACKGROUND OF INVENTION

1. Field of the Invention

The present invention relates to cavities and channel add/drop filters employing photonic crystals, and in particular to improvements in the characteristics of cavities and channel add/drop filters based on two-dimensional photonic crystals.

It should be understood that in the present specification, the significance of the term "light" is meant to also include electromagnetic waves that relative to visible light are of longer as well as shorter wavelength.

2. Description of the Background Art

Along with advances in wavelength division multiplexed (WDM) optical communication systems in recent years, the importance of ultrasmall add/drop filters and channel filters in which enlarged capacity is being targeted is on the rise. In this area, then, attempts are being made to develop extraordinarily small-scale optical add/drop filters by employing photonic crystals. In particular, with photonic crystals novel optical properties can be realized by exploiting artificial periodic structures in which a crystal-lattice-like periodic refractive index distribution is artificially imparted within the parent material.

One important feature of photonic crystals is the presence of photonic bandgaps. With photonic crystals having three-dimensional refractive index periodicity (3D photonic crystals), perfect bandgaps in which the transmission of light is prohibited in every direction can be formed. Among the possibilities with these crystals are the local confinement of light, control of spontaneous emission, and formation of waveguides by the introduction of line defects, wherein the realization of ultrasmall photonic integrated circuits can be anticipated.

Meanwhile, studies into uses for photonic crystals having a two-dimensional periodic refractive-index structure (2D photonic crystals), are flourishing because the crystals can be manufactured comparatively easily. A periodic refractive-index structure in 2D photonic crystals can be formed by, for example, arranging in a square-lattice or triangular-lattice geometry air rods perforating a high-refractive-index plate material (usually termed a "slab"). Alternatively the structure can be formed within a low-index material by arranging, in a 2D-lattice geometry within it, posts made of a high-refractive-index material. Photonic bandgaps can be produced from such periodic refractive-index structures, enabling the transmission of light traveling in an in-plane direction (direction parallel to both the principal faces of the slab) to be controlled. Waveguides, for instance, may be created by introducing line defects into a periodic refractive-index structure. (See, for example, *Physical Review B*, Vol. 62, 2000, pp. 4488–4492.)

FIG. 12 illustrates, in a schematic oblique view, a channel add/drop filter disclosed in Japanese Unexamined Pat. App. Pub. No. 2001-272555. (In the drawings in the present application, identical reference marks indicate identical or equivalent parts.) The channel add/drop filter in FIG. 12 exploits a 2D photonic crystal having, configured within a slab 1, cylindrical through-holes 2 of identical diameter (ordinarily occupied by air) formed at the vertices of a 2D triangular lattice. In a 2D photonic crystal of this sort, light is prohibited from propagating in an in-plane direction within the slab 1 by a bandgap, and in the direction normal to the plane (direction orthogonal to the two principal faces of the slab) is confined due to total internal reflection occurring at the interface with the low-refractive-index clad (air, for example).

The photonic crystal in FIG. 12 contains a waveguide 3 consisting of a straight line defect. This straight-line defect 3 includes a rectilinearly ranging plurality of lattice points adjoining each other, with the through-holes 2 missing in these lattice points. With light being able to propagate through defects in the 2D photonic crystal, the straight-line defect can be employed as a linear waveguide. With linear waveguides, the spectrum of wavelengths in which light can be transmitted at low loss is comparatively broad; consequently light in a wide range of wavelength containing signals in a plurality of channels may be propagated through them.

It will be appreciated that the width of straight-line defects as waveguides can be altered variously in accordance with the requested characteristics. The most typical waveguide is obtained, as described above, by leaving through-holes missing in one row in lattice-point line. Nevertheless, waveguides can also be created by leaving through-holes missing in a plurality of neighboring rows in the lattice-point lines. Moreover, a waveguide is not limited in width to integral multiples of the lattice constant, but may have an arbitrary width. For example, it is possible to create a waveguide having a width of choice by relatively displacing the lattice on either side of a linear waveguide to the distance of choice.

The photonic crystal set out in FIG. 12 also contains a cavity 4 consisting of a point defect. The point defect 4 contains a single lattice point, and through that lattice point a through-hole that is of large diameter as compared with the other lattice points is formed. A defect in this way containing a relatively large-diameter through-hole is generally termed an acceptor-type point defect. On the other hand, a defect in which a through-hole is missing in a lattice point is generally termed a donor-type point defect. The cavity 4 is disposed adjacent the waveguide 3, within a range in which they can exert on each other an electromagnetically reciprocal effect.

In a 2D photonic crystal such as that illustrated in FIG. 12, if light 5 containing a plurality of wavelength ranges ($\lambda_1$, $\lambda$, ... $\lambda_i$, ...) is introduced into the waveguide 3, light that has the specific wavelength corresponding to the resonant frequency of the cavity 4 is trapped in the cavity and while resonating in the interior of the point defect, light 6 of wavelength $\lambda_i$ is emitted in the normal direction, in which the Q factor originating in the finite thickness of the slab 1 is small. This means that the photonic crystal in FIG. 12 can be employed as a channel drop filter. Conversely, by shining light into the point defect 4, in the direction normal to the slab 1, light of wavelength $\lambda_i$ that resonates within the cavity 4 can be introduced into the waveguide 3. This means that the photonic crystal in FIG. 12 can also be employed as a channel add filter. It will be appreciated that the transfer of light between either the waveguide 3 or the cavity 4 and the exterior can be made to take place by proximately disposing an optical fiber or an optoelectronic transducer in the vicinity of the waveguide end faces or the vicinity of the cavity. Of course, in that case a collimating lens (collimator) may be inserted in between either the waveguide end face or the cavity, and the optical-fiber end face or the optoelectronic transducer.

In a an optical add/drop filter such as that illustrated in FIG. 12, by appropriately configuring the spacing between the waveguide 3 consisting of the line defect and the cavity 4 consisting of the point defect, the ratio of optical intensities in a specific wavelength that is transferred between the waveguide and the cavity can be controlled. Also in FIG. 12, since no asymmetry is introduced with respect to the point defect 4 in the direction normal to the slab 1, light is output in both vertical directions from the point defect 4; but it is possible to make the output of light be in only one or the other vertical direction by introducing asymmetry in the point defect 4 in the plane-normal direction. An example of a mechanism that can be utilized to introduce this sort of asymmetry is a method in which the diameter of the point defect 4, which is round in section, is made to vary continuously or discontinuously along the thickness of the slab. With further regard to FIG. 12, although the channel add/drop filter in the figure contains only a single cavity, it will be readily understood that by disposing along the waveguide a plurality of cavities differing from one another in resonant wavelength, optical signals in a plurality of channels can be added/dropped.

With the Q factor of a cavity employing an acceptor-type point defect such as disclosed in Japanese Unexamined-Pat. App. Pub. No. 2001-272555 being around 500, the full width at half-maximum (FWHM) in the peak-wavelength-including light output from a cavity of this sort is around 3 nm.

However, using multi-channel signals for WDM communications at about 100 GHz with a wavelength-peak spacing of approximately 0.8 nm is being investigated. This means that with a cavity such as disclosed in Unexamined Pat. App. Pub. No. 2001-272555, the largeness of the Q factor is insufficient, and with the 3-nm FWHM, the cavity is totally inadequate for separating from one another multi-channel signals whose peak-wavelength spacing is approximately 0.8 nm. In short, there is a need to raise the Q factor of cavities employing 2D photonic crystals, to reduce the FWHM of the peak-wavelength spectra they output.

SUMMARY OF INVENTION

A principal object of the present invention, in view of the situation with the conventional technology, is to afford a high-Q cavity within a 2D photonic crystal, and furthermore to combine such a cavity with a waveguide to make available a channel add/drop filter having high wavelength resolution.

A cavity made from a point defect within a two-dimensional photonic crystal in accordance with the present invention—the 2D photonic crystal being configured by an arrangement, in a two-dimensional lattice of points defined in a slab, of low-refractive-index substances having a low refractive index relative to the slab and being identical dimension and shape—is characterized in that the point defect contains a plurality of three or more lattice points that neighbor one another, and in these lattice points no low-refractive-index substances are arranged, and in that the low-refractive-index substance that should be arranged to correspond to at least one of the lattice points nearest the point defect is displaced by a predetermined distance from that lattice point.

Here, the low-refractive-index substance that would otherwise be arranged to correspond to at least one of the lattice points secondarily adjacent the point defect may be displaced by a predetermined amount from that lattice point. Preferably, furthermore, the point defect contains six or fewer of the lattice points. The wavelength of light that resonates in the cavity is adjustable in dependency upon the dimension and shape of the point defect, or may be adjusted by changing the lattice constant of the photonic crystal. It is preferable that the point defect contain the plurality of lattice points lined in a line segment.

The low-refractive-index substances can be filled into columns perforating the slab. The points in the two-dimensional lattice preferably are arrayed in a triangular lattice. The slab preferably has a refractive index of 2.0 or greater.

A channel add/drop filter in accordance with the present invention, including one or more cavities as in the foregoing, includes one or more waveguides made from a line defect within the two-dimensional photonic crystal, and is characterized in that the cavity is disposed adjacent the waveguide, within a separation in which between them an electromagnetically reciprocal effect is produced. By containing a plurality of cavities that differ from one another in resonant frequency, a channel add/drop filter of this sort can function as a channel add/drop filter for multi-channel optical communications.

From the following detailed description in conjunction with the accompanying drawings, the foregoing and other objects, features, aspects and advantages of the present invention will become readily apparent to those skilled in the art.

BRIEF DESCRIPTION OF DRAWINGS

FIGS. 13A and B are schematic plan views representing examples of donor-type point defects that contain a plurality of lattice points, in a 2D photonic crystal.

DETAILED DESCRIPTION

Figure 12:
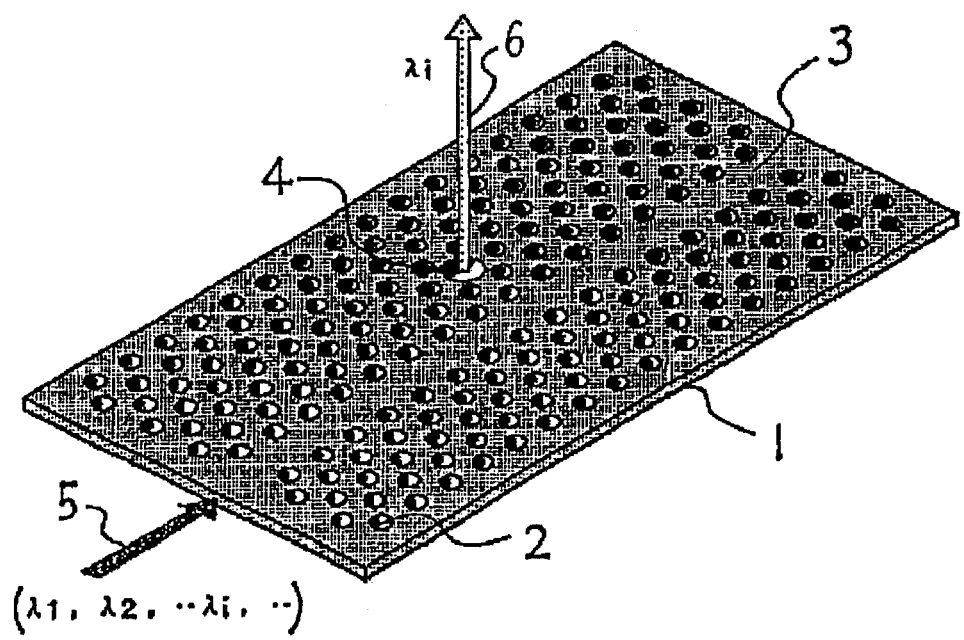
FIG. 12 is a schematic oblique view illustrating a channel add/drop filter employed in a 2D photonic crystal according to the prior art.

Initially the present inventors looked into the characteristics, within a 2D photonic crystal, not of a cavity consisting of an acceptor-type defect as in FIG. 12, but of a cavity consisting of a donor-type point defect. As described earlier, donor-type defects contain one or more lattice points, and through-holes are missing in those lattice points.

What has chiefly been studied to date are point defects containing only a single lattice point, from the perspectives that owing to their structural simplicity they are easily analyzed electromagnetically and that they are of minimal size. This has meant that with donor types as well, point defects that contain a plurality of lattice points have not to date been studied extensively. Given the circumstances, then, the present inventors investigated the characteristics of donor-type point defects that contain a plurality of lattice points.

FIG. 13 is a schematic plan view representing a portion of a 2D photonic crystal including a donor-type point defect that contains a plurality of lattice points. In this 2D photonic crystal, through-holes 2 are provided at the vertices of a triangular lattice configured within a slab 1. Point defect 4 in FIG. 13A contains three lattice points neighboring one another in line-segment form, with no through-holes 2 being furnished in these lattice points. Meanwhile, point defect 4 in FIG. 13B contains three lattice points neighboring one another in a triangular geometry, with no through-holes 2 being furnished in these lattice points. In other words, the point defect 4 can be formed to contain a plurality of lattice points neighboring one another one-dimensionally, or may be formed to contain a plurality of lattice points neighboring one another two-dimensionally.

Using the widely known finite-difference time-domain (FDTD) method (see Japanese Unexamined Pat. App. Pub. No. 2001-272555), the present inventors carried out electromagnetic analyses on donor-type defects containing a plurality of lattice points, wherein they found that compared with cavities consisting of donor-type point defects that contain one or two lattice points, high Q values are obtained with cavities consisting of donor-type point defects that contain three or more lattice points. Nevertheless, if the number of lattice points that are contained in the point defect is too large, the number of resonant modes will be undesirably many, thus the number of lattice points preferably is six or fewer.

For example, with a cavity as is represented in FIG. 13A, in the simple base structure, Q=5200, and when compounded with a waveguide the filter is able to yield a Q factor of about 2600, with the FWHM of the light output from the cavity being approximately 0.6 nm. Still, taking into account crosstalk in WDM optical communication that employs multi-channel signals at about 100 GHz with a wavelength-peak spacing of approximately 0.8 nm, further improvement in Q factor is to be desired.

Figure 1:
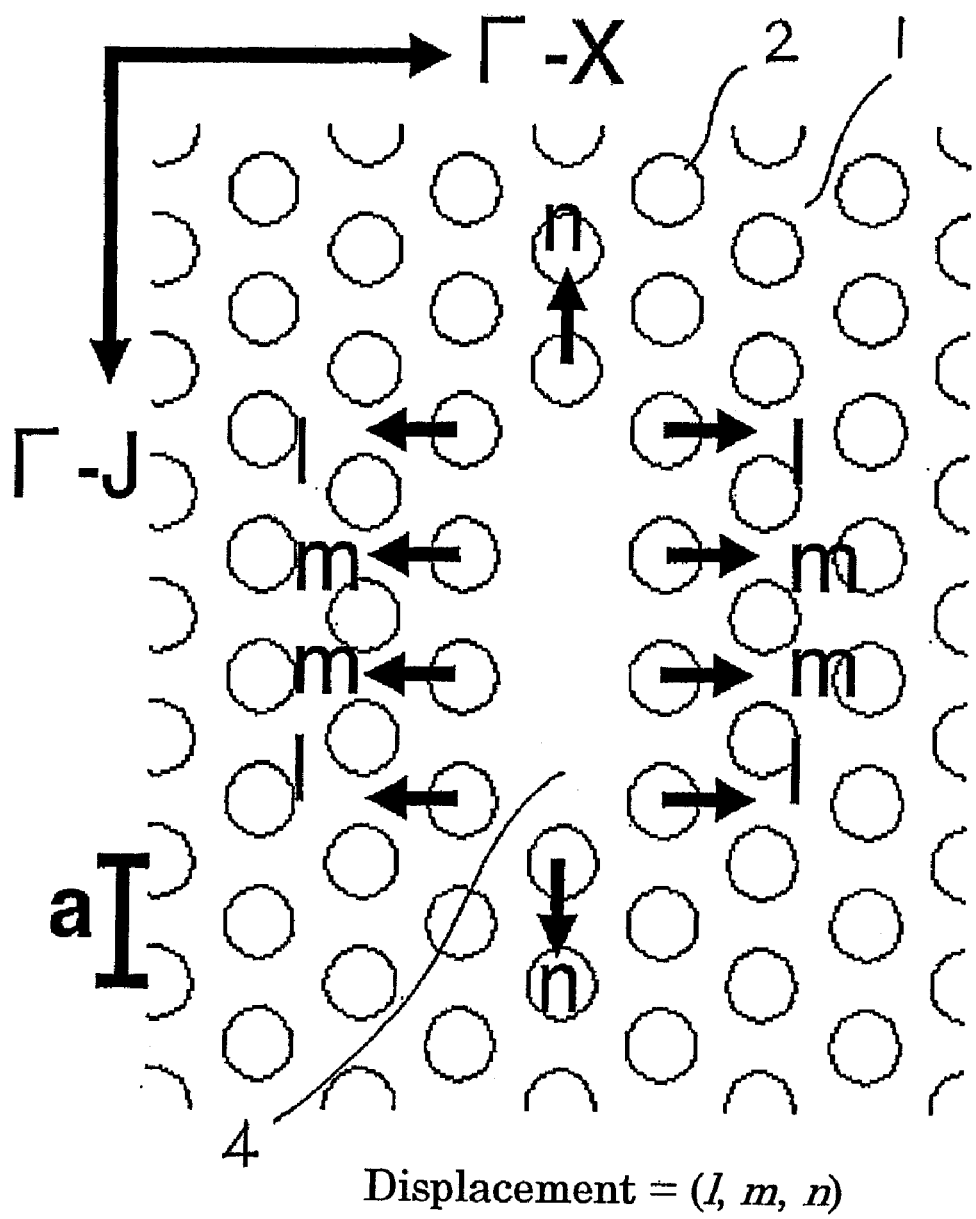
FIG. 1 is a schematic plan view for explaining principal features in one example of a cavity in a photonic crystal according to the present invention.

FIG. 1 is a schematic plan view for explaining principal features in one example of a cavity as defined by the present invention. A two-dimensional lattice of triangular vertices is defined in this 2D photonic crystal in FIG. 1, and round tubular through-holes 2 of identical shape are formed at the lattice points. The spacing between adjacent-most lattice points in (the lattice constant of) the triangular lattice is indicated by a. The donor-type point defect illustrated in FIG. 1 contains three lattice points neighboring one another and ranging in a line-segment formation; the through-holes 2 are missing in these lattice points.

A principal feature with the donor-type point defect according to the present invention is that at least one of the through-holes 2 nearest the point defect is formed displaced by a predetermined distance from its corresponding lattice point. In FIG. 1 the $\lceil$-X and $\lceil$-J axes, which are at right angles to each other, indicate the directions in which the through-hole 2 is set apart from its corresponding lattice point. In FIG. 1 also, the arrows labeled with reference marks l, m and n indicate the directions in which the through-holes 2 formed corresponding to the lattice points nearest the point defect are displaced from those lattice points. It will be appreciated that inasmuch as the displacement directions in FIG. 1 are merely for illustration, the through-holes 2 may of course be displaced in any direction of choice.

Hereinafter the state in which the through-holes 2 nearest the point defect are displaced from the original lattice points to which they correspond is expressed as "displacement=(l, m, n)." For example, the expression "displacement=(0.1a, 0.2a, 0.3a)" means that the through-holes corresponding to the arrows labeled with reference mark l are displaced from their corresponding lattice points by the distance 0.1a, likewise means that the through-holes corresponding to the arrows labeled with reference mark m have been displaced from their corresponding lattice points by the distance 0.2a, and that the through-holes corresponding to the arrows labeled with reference mark n have been displaced from their corresponding lattice points by the distance 0.3a.

The Q factor and electric field pattern (radiation pattern) for a cavity made from a donor-type point defect 4 as is illustrated in FIG. 1 were simulated by the FDTD method. The simulation parameters were configured by selecting silicon for the slab 1; and setting approximately 1.55 □m, which is generally used in optical communications, for the wavelength λ; 0.42 □m for the lattice constant a; 0.6a for the slab 1 thickness; and 0.29a for the sectional radius of the through-holes 2.

Figure 2:
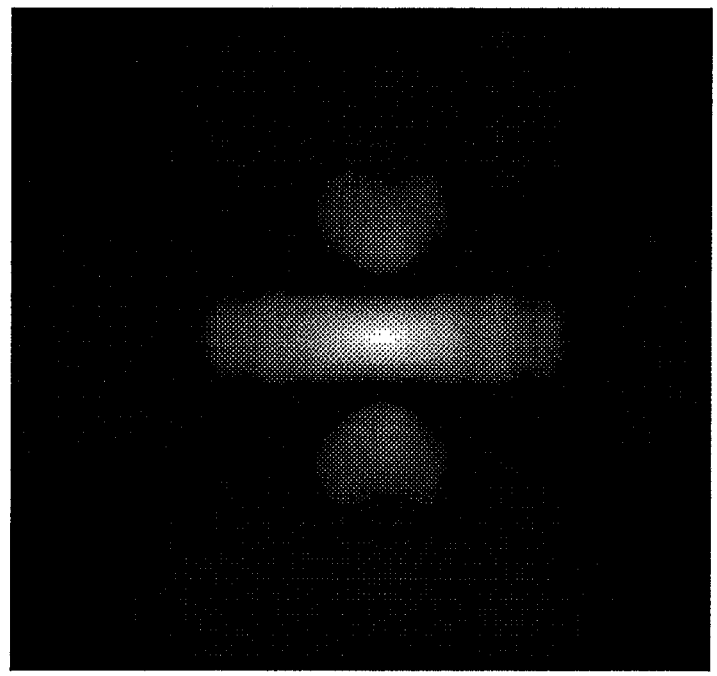
FIG. 2 is a picture, in a simulation pertaining to one example of a cavity within a 2D photonic crystal, showing the radiation pattern of light from the cavity, seen in the direction normal to the slab.
Figure 3:
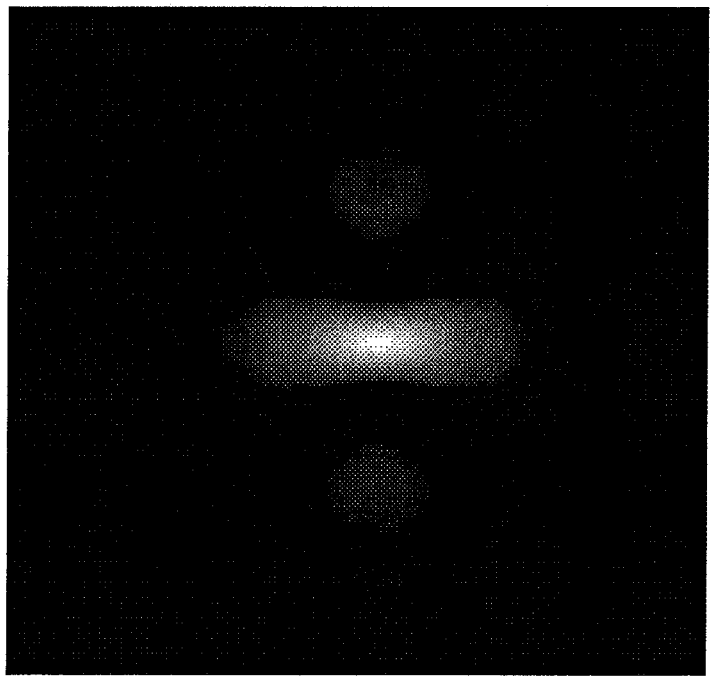
FIG. 3 is a picture, in a simulation pertaining to one example of a cavity according to the present invention, showing the radiation pattern of light from the cavity, seen in the direction normal to the slab.

For a case where (l, m, n)=(0, 0, 0) in the simulation under these conditions, a Q factor of 5200 was obtained; FIG. 2 shows the radiation pattern of light from the cavity 4 in this case, seen in the direction normal to the slab 1. For a case where (l, m, n)=(0, 0, 0.15a) in a similar simulation, a Q factor of 43,000 was obtained; FIG. 3 shows the radiation pattern of light from the cavity 4 in this case.

As will be understood from these simulations, in a donor-type point defect that contains three lattice points neighboring one another in a line-segment formation, displacing the through-hole neighboring both ends of the line segment a distance of 0.15a from its corresponding lattice point dramatically raises the Q factor from 5200 to 43,000 and meanwhile, as will be understood from a comparison between FIGS. 2 and 3, reduces the radiation angle of the light.

Figure 4:
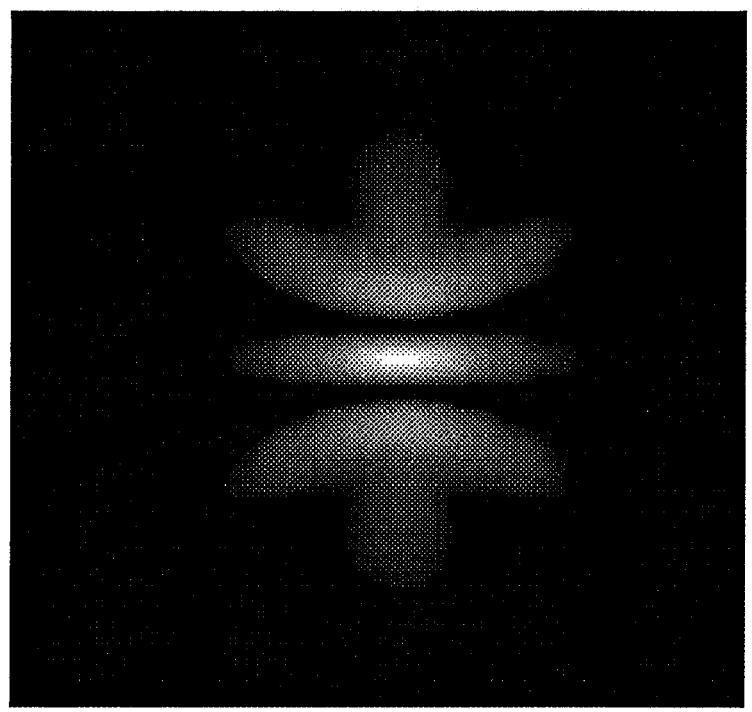
FIG. 4 is a picture, in a simulation pertaining to another example of a cavity according to the present invention, showing the radiation pattern of light from the cavity, seen in the direction normal to the slab.

In a further case, in which the displacement n was made greater by making (l, m, n)=(0, 0, 0.20a), a still higher Q=100,000 was obtained; FIG. 4 shows the radiation pattern of light from the cavity in this case. Compared with FIG. 3, in FIG. 4 the radiation angle of the light is large, and side lobes (secondary beams) above and below the main emission beam in the center in FIG. 4 are conspicuous. This means that along with an enlargement of the distance by which the through-holes 2 nearest the point defect 4 are displaced from their corresponding lattice points, the Q also trends to an enlarged value, but considered in terms of the radiation angle of the light from the cavity 4, the displacement should not necessarily be large.

Figure 5:
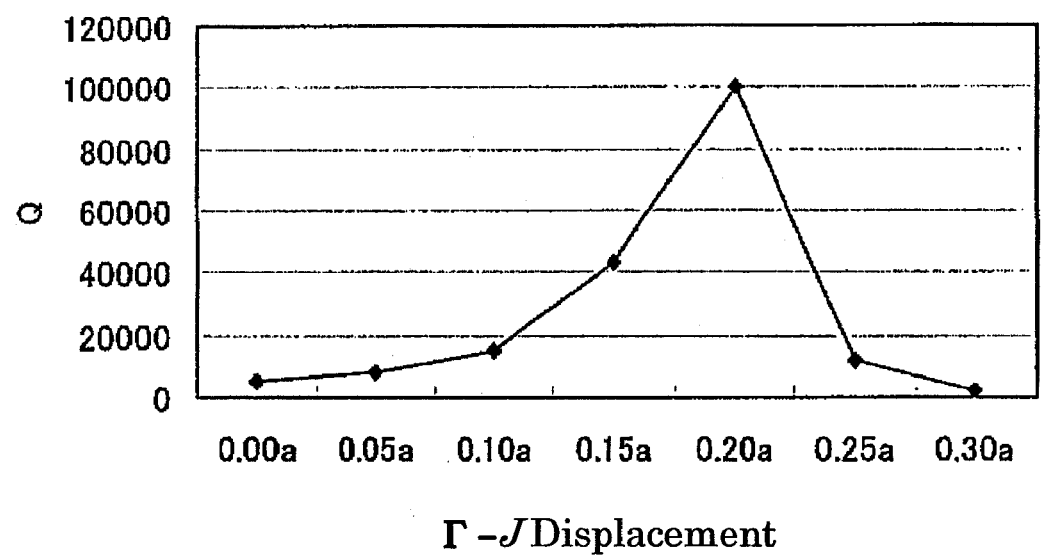
FIG. 5 is a graph that plots the relationship between displacement n in the □-J direction and Q factor, for a point defect as illustrated in FIG. 1.

Reference is made to FIG. 5, which is a graph that plots the relationship between displacements in the Γ-j direction and Q factor, for a point defect as illustrated in FIG. 1. In the graph, the horizontal axis indicates displacement n scaled by the lattice constant a, while the vertical axis expresses Q factor. From FIG. 5 it will be understood that there is a limit to how far Q factor is enlarged by increasing the displacement n. Specifically, as the displacement n is increased up to 0.20a the Q factor increases exponentially also, reaching a maximum value of 100,000; but if the displacement n is increased further the Q factor on the contrary decreases sharply.

Figure 6:
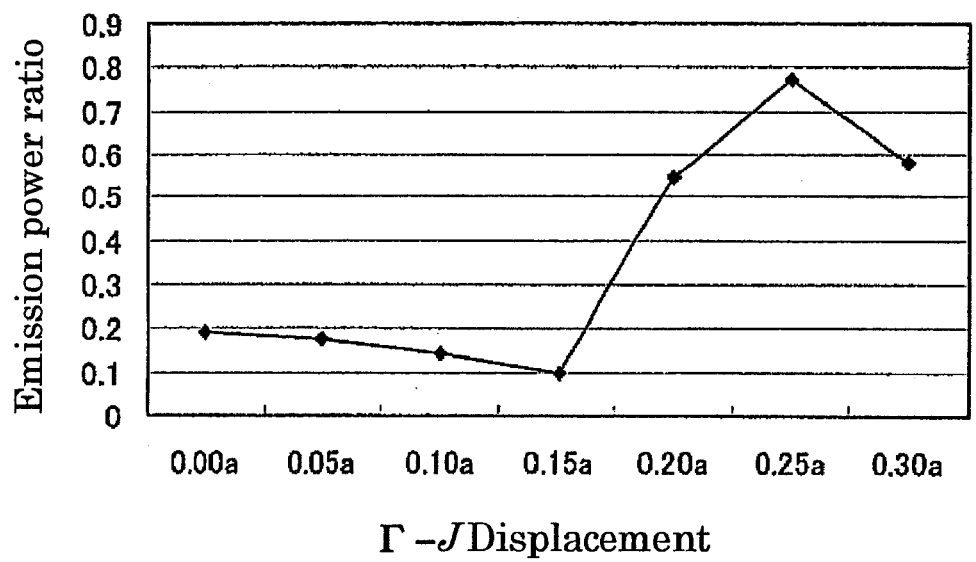
FIG. 6 is a graph that plots the power ratio of side lobes with respect to the main emission beam from a cavity, in relationship to displacement n.

In the FIG. 6 graph, the relationship between the displacement n and the power ratio of side lobes, such as can be distinctly seen in FIG. 4, to the main emission beam is shown. In the graph, the horizontal axis indicates displacement n scaled by the lattice constant a, while the vertical axis expresses the ratio of side-lobe emission power to the main emission beam. In FIG. 6 it is evident that the emission-beam radiation angle containing the side lobes is smallest in the case where the displacement n is 0.15a, while it is greatest in the case where the displacement n is 0.25a.

Figure 7:
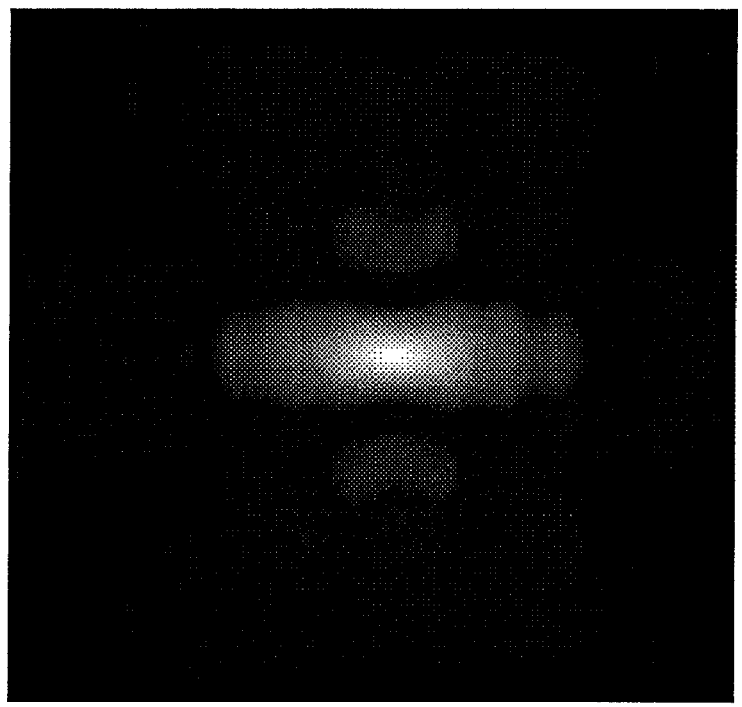
FIG. 7 shows the radiation pattern of light from a cavity, seen in the direction normal to the slab in a simulation pertaining to yet another example of a cavity according to the present invention.

A high Q=11,900 is also obtained in a case where the displacements are (l, m, n)=(0.11a, 0.11a, 0), compared with the (l, m, n)=(0, 0, 0) case where the through-holes are not displaced from the lattice points; FIG. 7 shows the radiation pattern of light from the cavity in this case. As will be understood from a comparison with the (l, m, n)=(0, 0, 0) case in FIG. 3, in FIG. 7 the radiation angle of the light emission is smaller.

Figure 8:
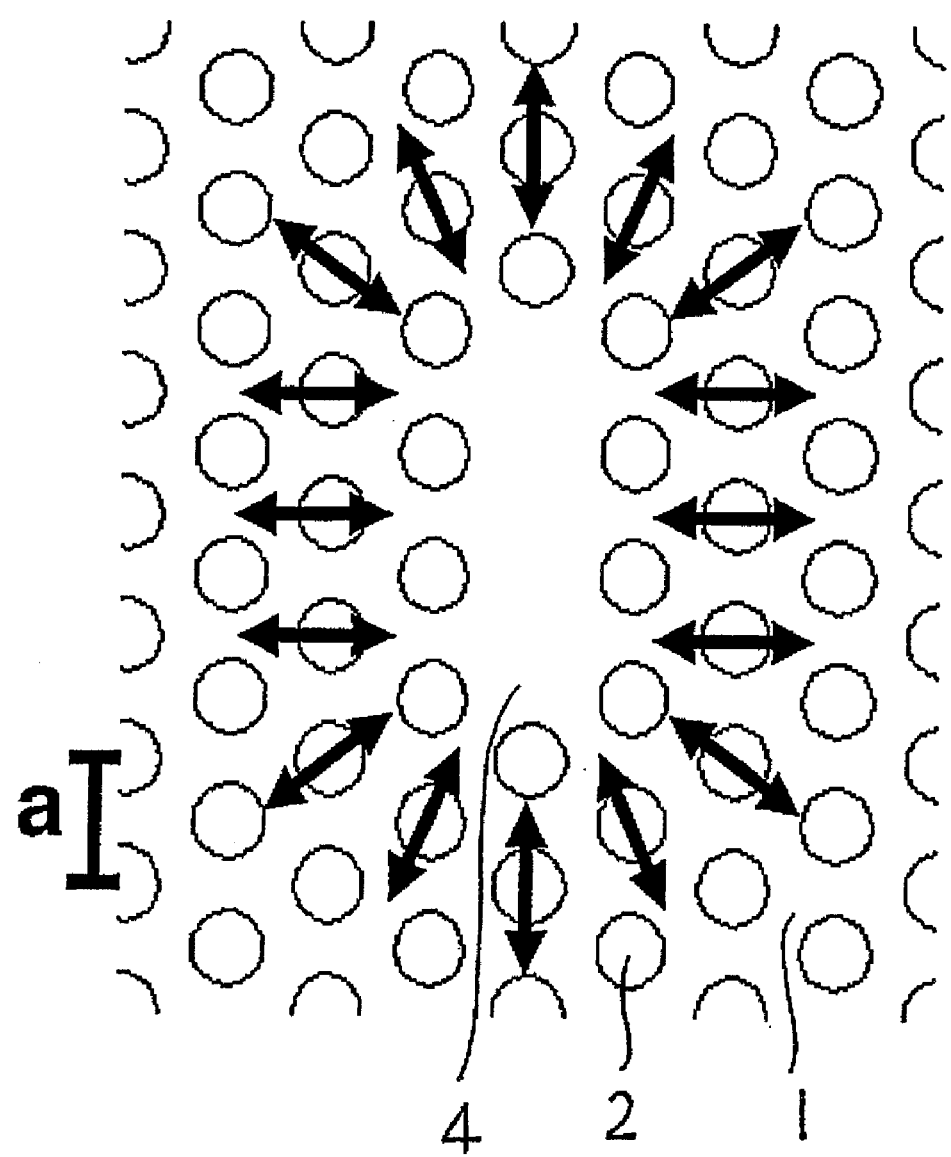
FIG. 8 is a plan view schematically illustrating a situation in which not only at least one of through-holes corresponding to the lattice points nearest a point defect, but also at least one of through-holes corresponding to the secondarily adjacent lattice points, is displaced by a predetermined distance from its corresponding lattice point.

Reference is now made to FIG. 8, a schematic plan view that, while resembling FIG. 1, diagrammatically illustrates a case where not only at least one of the through-holes 2 corresponding to the lattice points nearest the point defect 4, but also at least one of the through-holes 2 corresponding to the secondarily adjacent lattice points, is displaced by a predetermined distance from its corresponding lattice point. Although what is most effective improving the Q factor of the cavity is as described above displacing through-holes corresponding to the lattice points nearest the point defect 4 by a predetermined distance from its corresponding lattice point, additionally displacing through-holes 2 corresponding to the secondarily adjacent lattice points by a predetermined distance from its corresponding lattice point also produces an effect of bettering the Q factor.

Figure 9:
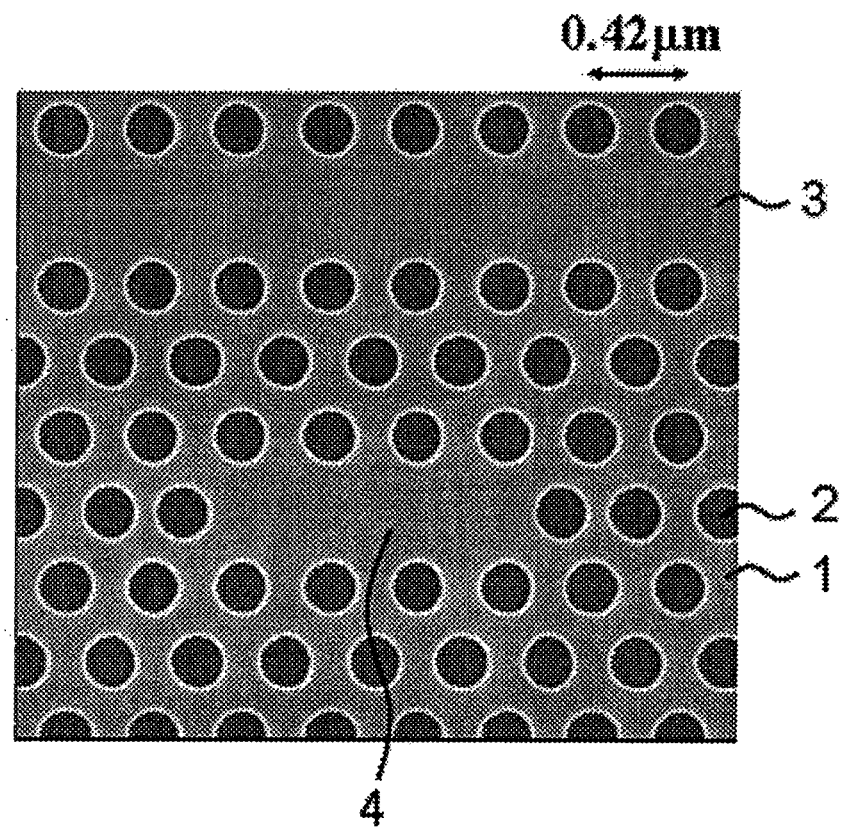
FIG. 9 is a scanning electron micrograph (SEM) showing a channel add/drop filter in a 2D photonic crystal actually fabricated by the present invention.

Reference is now made to FIG. 9, a scanning electron micrograph (SEM) showing a portion of an actually fabricated 2D photonic crystal. Configuration parameters for the 2D photonic crystal—including the substance for the slab 1, the two-dimensional lattice constant, the through-hole 2 diameter, and the number and arrangement of the lattice points that the point defect 4 contains—are likewise as was the case in the simulation set forth above, while the displacements were set to (l, m, n)=(0, 0, 0.15a).

Electron-beam lithography and reactive ion etching (see Japanese Unexamined Pat. App. Pub. No. 2001-272555) were employed to fabricate the photonic crystal of FIG. 9 and to contain, in addition to the point defect 4, a straight waveguide 3. This meant that light of a predetermined wavelength could be transferred between the cavity constituted by the point defect 4, and the straight waveguide 3, allowing the device to function as a channel add/drop filter.

Figure 10:
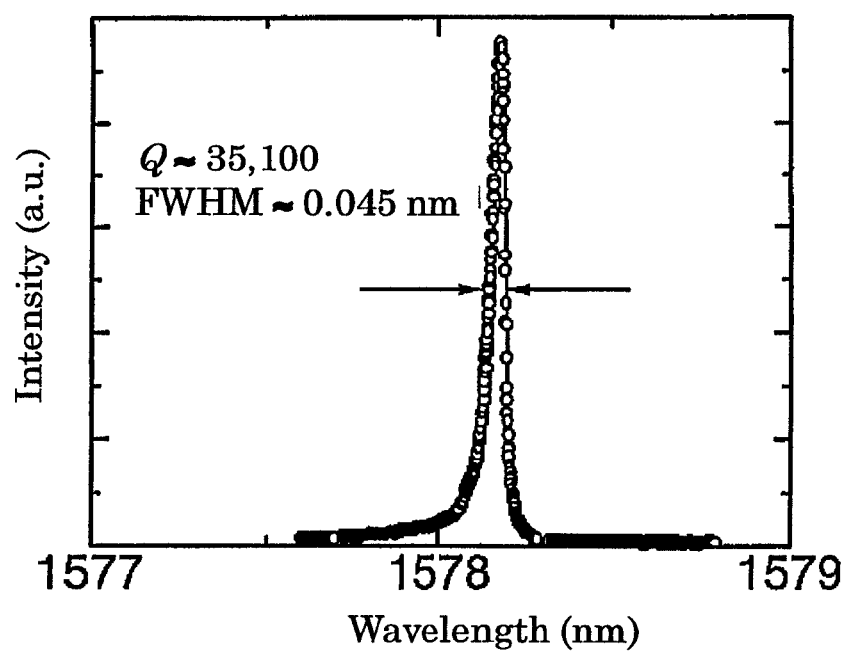
FIG. 10 is a graph that plots the relationship between wavelength and intensity of light emitted from a cavity in the direction normal to the slab, in a case where light including a variety of wavelengths was introduced into the waveguide in FIG. 9.

In the FIG. 10 graph, the relationship between wavelength and intensity of light emitted from the cavity 4 in the direction normal to the slab 1, in a case where light including a variety of wavelengths was actually introduced into the waveguide 3 in FIG. 9. In particular, the horizontal axis in the graph expresses wavelength (nm), and the vertical axis expresses intensity of light (a.u.: arbitrary units). As is evident from FIG. 10, the cavity 4 included in the channel add/drop filter of FIG. 9 extracted from the wavelengths of light introduced into the waveguide 3 light having a peak wavelength of approximately 1578.2 nm, emitted at a full width at half-maximum (FWHM) of approximately 0.045 nm, and had a high Q factor—as anticipated by the above-described simulation—of about 35,100. It will thus be understood that as provided for by the present invention, a channel add/drop filter having a high wavelength resolution can be achieved.

It should be understood that although in the channel add/drop filter of FIG. 9 only one cavity is disposed proximate the one waveguide, a multi-channel add/drop filter that can handle optical communications in a plurality of channels differing from one another in wavelength can of course be created by disposing in proximity along a single waveguide a plurality of cavities differing from one another in resonant frequency. Also, by disposing the end face of an optical fiber to confront the cavity 4 proximately, the light emitted from the cavity 4 in the direction normal to the slab 1 can be introduced into the optical fiber. Furthermore, by disposing an optoelectronic transducer to confront the cavity 4 proximately intensity modulations in the light from the cavity can be received. It will be appreciated by those skilled in the art that a collimating lens (collimator) may be inserted in between the cavity 4 and either the optical-fiber end face or the optoelectronic transducer.

Figure 11:
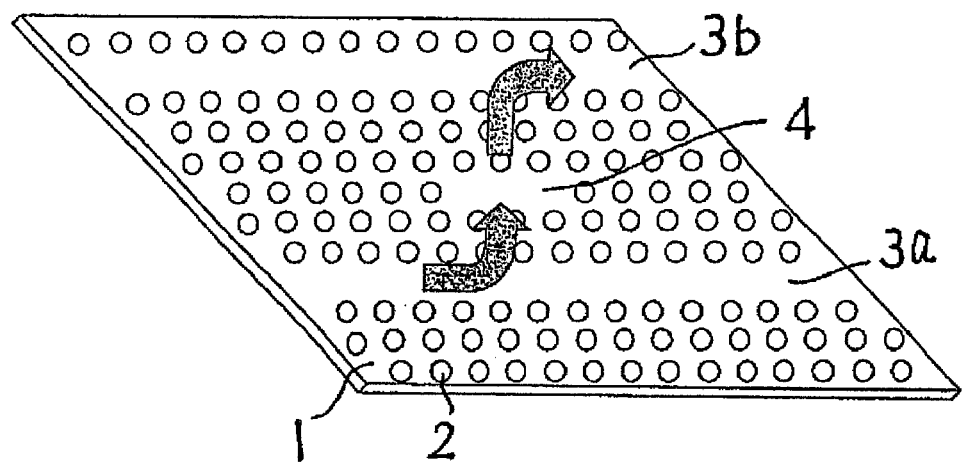
FIG. 11 is a schematic oblique view illustrating a channel add/drop filter in another example of an embodiment of the present invention.

Reference is now made to FIG. 11, schematically illustrating in an oblique view a channel add/drop filter in another example of an embodiment of the present invention. Although the channel add/drop filter of FIG. 11 resembles that of FIG. 9, in FIG. 11 a cavity 4 is disposed adjacent a first straight waveguide 3a and further, a second waveguide 3b is disposed adjacent the cavity 4. In this instance, as described earlier an optical signal of a specific wavelength can be extracted within the cavity 4 from optical signals introduced into the first waveguide 3a, but with the second waveguide 3b being disposed adjacent the cavity 4 the extracted optical signal is introduced from the cavity 4, not in the plane-normal of, but into the second waveguide 3b in, the slab 1. This means that in a channel add/drop filter employing a 2D photonic crystal, an optical signal of a given wavelength among optical signals that propagate through one waveguide can be selectively guided into another waveguide.

A material whose refractive index is large is desirable as the slab 1 for the photonic crystal, inasmuch as it must confine light along its thickness. In the embodiments described above, an Si (silicon) slab was utilized, but materials other than silicon that may be utilized include: Group IV semiconductors such as Ge, Sn, C and SiC; Group III–V semiconductor compounds such as GaAs, InP, GaN, GaP, AlP, AlAs, GaSb, InAs, AlSb, InSb, InGaAsP and AlGaAs; Group II–VI semiconductor compounds such as ZnS, CdS, ZnSe, HgS, MnSe, CdSe, ZnTe, MnTe, CdTe and HgTe; oxides such as $SiO_2$, $Al_2O_3$ and $TiO_2$; silicon nitride; various glass of all sorts, such as soda-lime glass; as well as organic substances such as Alq3 ($C_{27}H_{18}AlN_3O_3$). In situations where amplification of optical signals in photonic crystals constituted from these slabs is desired they may be doped with Er.

It is preferable that the refractive index of the slab 1 be, specifically, greater than air—2.0 or greater, with 3.0 or greater being more preferable. It will be appreciated by those skilled in the art that while air is present within the through-holes 2 in the embodiments described above, a substance of low refractive index relative to the slab 1 may of course be filled into the through-holes 2. A substance such as conducting polythiophene, for example, may be utilized as the low-refractive-index material. Furthermore, the two-dimensional lattice configured within the slab 1 is not limited to being a triangular lattice but can be configured as any other regular two-dimensional lattice of choice. And the cross section of the through-holes 2 is not limited to being round but may be other shapes; or the cross-sectional form may be varied along the slab thickness.

As given in the foregoing the present invention affords, in 2D photonic crystals, cavities in which the Q factor is heightened, and by combining a cavity of that sort with a waveguide, furthermore makes available channel add/drop filters having high wavelength resolution.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. In a two-dimensional photonic crystal configured by an arrangement, in a two-dimensional lattice of points defined in a slab, of low-refractive-index substances having a small refractive index relative to the slab and being of identical dimension and shape, a cavity made from a point defect within the two-dimensional photonic crystal, wherein:
    said point defect contains among said lattice points a plurality of three or more neighboring one another, and in said plurality of three or more lattice points said low-refractive-index substances are missing from said arrangement; and
    in said arrangement at least one of said low-refractive-index substances being arranged to correspond to at least one among those of said lattice points being nearest said point defect is displaced by a predetermined distance from said at least one of said lattice points nearest said point defect.

2. A cavity as set forth in claim 1, wherein in said arrangement at least one of said low-refractive-index substances arranged to correspond to at least one among those of said lattice points being secondarily adjacent said point defect is displaced by a predetermined amount from said at least one of said lattice points secondarily adjacent said point defect.

3. A cavity as set forth in claim 1, wherein said point defect contains six or fewer of said lattice points.

4. A cavity as set forth in claim 1, wherein the wavelength of light that resonates in said cavity is adjustable in dependency upon the dimension and shape of said point defect.

5. A cavity as set forth in claim 1, wherein said point defect contains said plurality of lattice points in a form in which said plurality is lined in a line segment.

6. A cavity as set forth in claim 1, wherein said low-refractive-index substances are filled into columns perforating said slab.

7. A cavity as set forth in claim 1, wherein the points in said two-dimensional lattice are arrayed in a triangular lattice.

8. A cavity as set forth in claim 1, wherein said slab has a refractive index of claim 2:0 or greater.

9. A cavity as set forth in claim 1, wherein said low-refractive-index substances are air.

10. In a two-dimensional photonic crystal, a channel add/drop filter comprising:
    at least one waveguide made from a line defect within said two-dimensional photonic crystal; and
    at least one cavity as set forth in claim 1, said cavity being disposed adjacent said waveguide, within a separation in which an electromagnetically reciprocal effect is produced between said cavity and said waveguide.

11. A channel add/drop filter as set forth in claim 10, comprising a plurality of said cavities, wherein said cavities differ from one another in resonant frequency.

* * * * *